(12) United States Patent
Jarstad et al.

(10) Patent No.: US 6,472,723 B1
(45) Date of Patent: *Oct. 29, 2002

(54) SUBSTRATE CONTACTS AND SHIELDING DEVICES IN A SEMICONDUCTOR COMPONENT

(75) Inventors: Tomas Jarstad, Sollentuna (SE); Hans Norström, Solna (SE)

(73) Assignee: Telefonaktiebolaget LM Ericsson (publ), Stockholm (SE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/821,880

(22) Filed: Mar. 21, 1997

(30) Foreign Application Priority Data

Mar. 22, 1996 (SE) .............................. 9601119
Apr. 16, 1996 (SE) .............................. 9601444

(51) Int. Cl.⁷ ................... H01L 23/552; H01L 29/00; H01L 23/58; H01L 23/34
(52) U.S. Cl. ................... 257/659; 257/508; 257/503; 257/630; 257/660; 257/725
(58) Field of Search ............... 257/508, 774, 257/698, 758, 301, 503, 659, 520, 662, 409, 340, 630, 660, 688, 725, 752, 767

(56) References Cited

U.S. PATENT DOCUMENTS

| | | | |
|---|---|---|---|
| 4,470,062 A | * 9/1984 | Muramatsu | 257/520 |
| 5,151,770 A | * 9/1992 | Inoue | 257/508 |
| 5,196,723 A | 3/1993 | Andersson et al. | |
| 5,196,920 A | * 3/1993 | Kumamoto et al. | 357/84 |
| 5,406,125 A | * 4/1995 | Johnson et al. | 257/774 |
| 5,432,377 A | 7/1995 | Litwin | |
| 5,453,640 A | * 9/1995 | Kinoshita | 257/520 |
| 5,566,052 A | * 10/1996 | Hughes | 361/704 |
| 5,574,621 A | * 11/1996 | Sakamoto et al. | 257/301 |
| 5,821,604 A | * 10/1998 | Egawa | 257/659 |
| 6,011,297 A | * 1/2000 | Rynne | 257/526 |
| 6,307,252 B1 | * 10/2001 | Knoedl, Jr. | 257/659 |
| 6,384,463 B1 | * 5/2002 | Miles et al. | 257/499 |

FOREIGN PATENT DOCUMENTS

| | | | |
|---|---|---|---|
| DE | 43 14 906 | 11/1994 | |
| EP | 567 694 | 11/1993 | |
| JP | 359076470 | * 5/1984 | 257/630 |

OTHER PUBLICATIONS

Japanese Abstract No. 63–065641 (Mar. 24, 1988).
K. Joardar, "A Simple Approach to Modeling Cross–Talk in Integrated Circuits," IEEE Journal of Solid–State Circuits, vol. 29, No. 10, pp. 1212–1219 (Oct. 1994).

* cited by examiner

*Primary Examiner*—Eddie Lee
*Assistant Examiner*—Jesse A. Fenty
(74) *Attorney, Agent, or Firm*—Burns, Doane, Swecker & Mathis, L.L.P.

(57) ABSTRACT

Apparatus and methods for manufacturing low-resistant substrate contacts in integrated circuits are disclosed. The contacts are low resistive conducting plugs and are located outside the areas of active components. The substrate is connected from the top portion in order to obtain a low resistance. Multiple metal plugs electrically interconnect the substrate of the integrated circuit with the top portion of the integrated circuit.

27 Claims, 7 Drawing Sheets

SUBSTRATE CONTACTS AND SHIELDING DEVICES IN A SEMICONDUCTOR COMPONENT

TECHNICAL FIELD

The present invention relates to devices, in particular substrate contacts and shielding devices, in a semiconductor component and methods of manufacturing these. Furthermore, the invention relates to a method of arranging substrate contacts.

BACKGROUND OF THE INVENTION AND PRIOR ART

In manufacturing silicon components being densely packed it is of great importance to avoid undesired coupling between different blocks of components located on the same silicon substrate. Such an undesired coupling or "cross-talk" between different blocks is most often more inconvenient in the manufacturing of analogue digital integrated circuits (IC) of a so called mixed-mode type. Cross-talk between different circuit blocks can either take place via capacitive coupling between the connection conductors or via substrate coupling. A number of different approaches for minimizing cross-talk, via the substrate, are described in literature, see for example K. Joardar; "A simple approach to modeling cross-talk in integrated circuits", IEEE J. Solid State Circuits. vol. 29, 1994, pp. 1212.

It is characteristic of all described techniques that different types of isolation methods in combination with substrate contacts for suppressing cross-talk are used. In addition to having good isolation between the respective blocks it is also required that the subtract contact is made as low-resistant as possible in order to achieve the best possible result.

The drawback with the methods described in the paper mentioned above, is that the contact resistance between the metal and substrate becomes comparatively high, since doped silicon, a P-plug, is used as connection. Said diffusion of a P-type must also be made having a depth of several $\mu$m in order to secure contact between a high-doped substrate and metal. This requires a long drive-in diffusion time in combination with a high drive-in diffusion temperature which is not desirable in the manufacturing of modern components where a low temperature budget is aimed at. Last but not least, the P$^+$-diffusion, i.e. the so called guard-ring, is space demanding, since lateral diffusion takes place simultaneously with the vertical diffusion.

SUMMARY

It is an object of the present invention to provide a low-resistant substrate contact for semiconductor components which overcomes the drawbacks arising when forming substrate contacts according to prior art.

It is further an object of the present invention to provide a method of locating and arranging these substrate contacts around a component or a block of components in order to obtain a good shielding between different components or blocks of components.

These and other objects are obtained using a substrate contact made of metal, extending deep down into the underlying semiconductor material, all the way down into the substrate. Furthermore, by means of locating several such metallic substrate contacts at close intervals around components or blocks of components effective shielding towards undesired coupling or cross-talk is achieved.

Thus, a semiconductor component is obtained in a usual manner by means of using different substructures at and/or on a surface of a substrate. There is an electrical connection in the shape of a plug of a material with good electrical conductivity between the substrate and the surface at and/or next to the semiconductor component. The material can be of another type than the substrate, which typically is semi-conductive and can have different types of doping. The plug is preferably a metal plug and in any case extends from an inner part of the substrate to an area close to the surface next to or at the semiconductor component. Furthermore, the plug should extend deeper down into the substrate than into the PN-junctions introduced and/or existing in the substrate. Several such plugs are preferably arranged around the surface of the semiconductor component and can then serve as electrical shielding of the semiconductor component. Furthermore, the upper ends of the plugs are preferably electrically connected as by means of layers or paths of an electrically conducting material, which as above can be a material with good electrical conductivity, in particular a metal material.

In the manufacturing of the plugs, suitably shaped holes are first made and which then are filled with the electrically conducting material.

The filling is preferably provided at the same time as other contact holes for electrical contact with different electrodes in the semiconductor are filled. Holes can then be made having a diameter or largest across corner dimension, which essentially corresponds to the corresponding measures for the contact holes. In any event the diameters of the holes should be chosen so that they are completely filled in the process step for filling the contact holes.

Plugs of the above mentioned kind can also be arranged alongside a shielded electrical signal conductor in a semi-conductor structure. The plugs must be arranged so close as to obtain a good lateral shielding of the electrical signal conductor. Shielding in a vertical direction can be achieved by means of suitable metal planes below and/or above the signal conductor, which can be manufactured at the same time as other metal planes in the semiconductor structure. The plugs are preferably in electrical connection with these metal planes.

DESCRIPTION OF THE DRAWINGS

The invention will now be described by way of non-limiting examples and with reference to the appended drawings, in which.

DESCRIPTION OF PREFERRED EMBODIMENTS

Figure 1A:
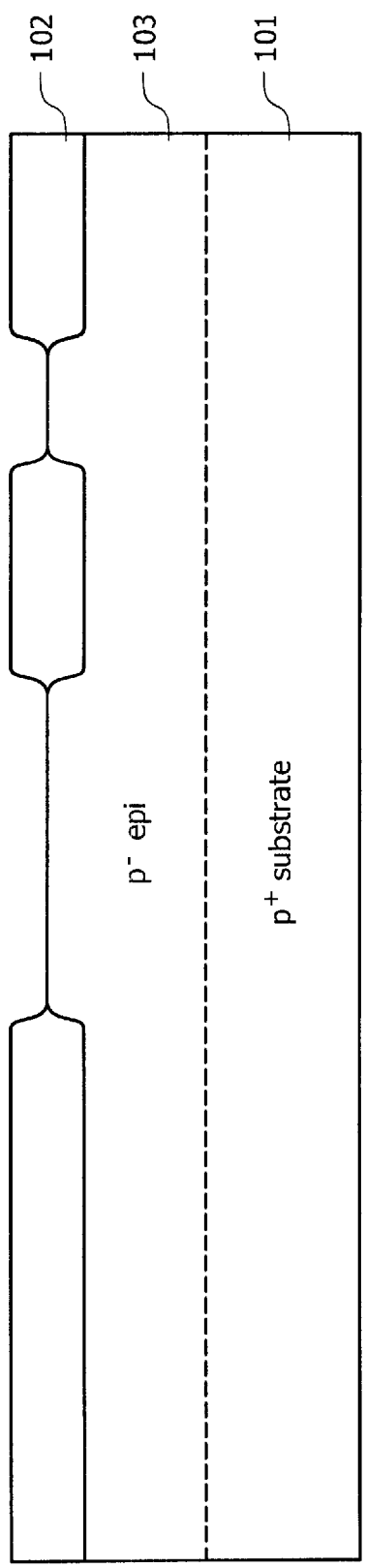
FIGS. 1a–1c show different steps carried out in the manufacturing of a substrate contact.
Figure 1B:
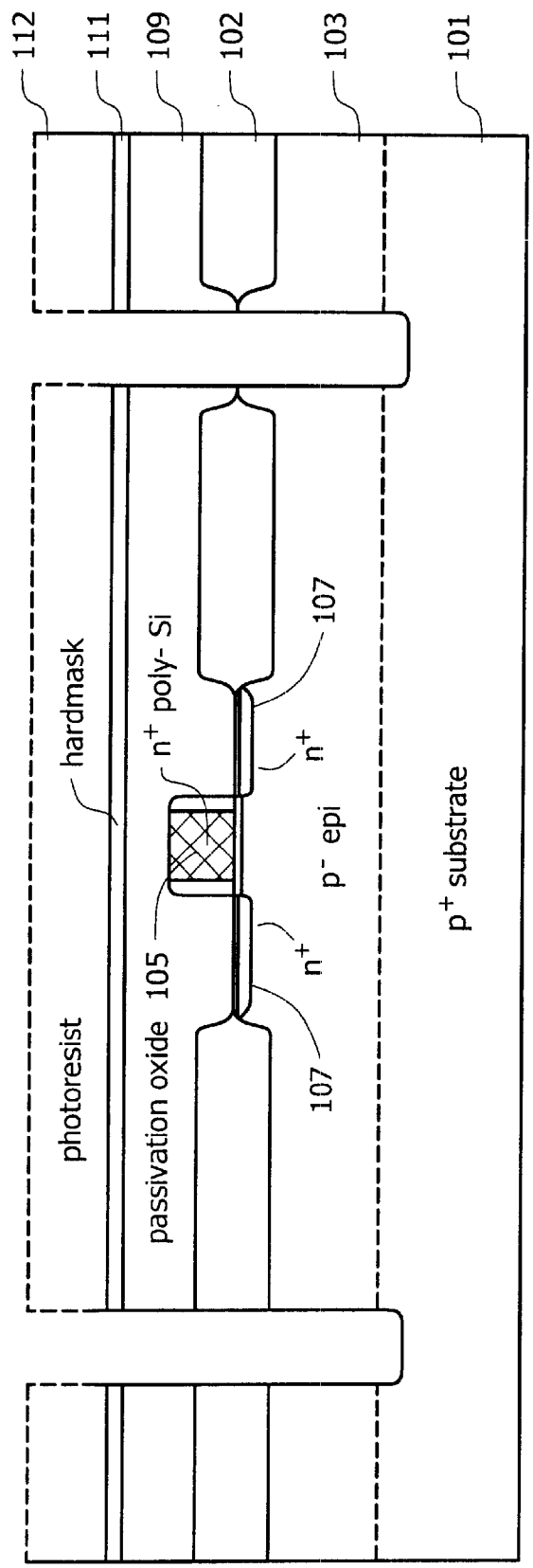
Figure 1C:
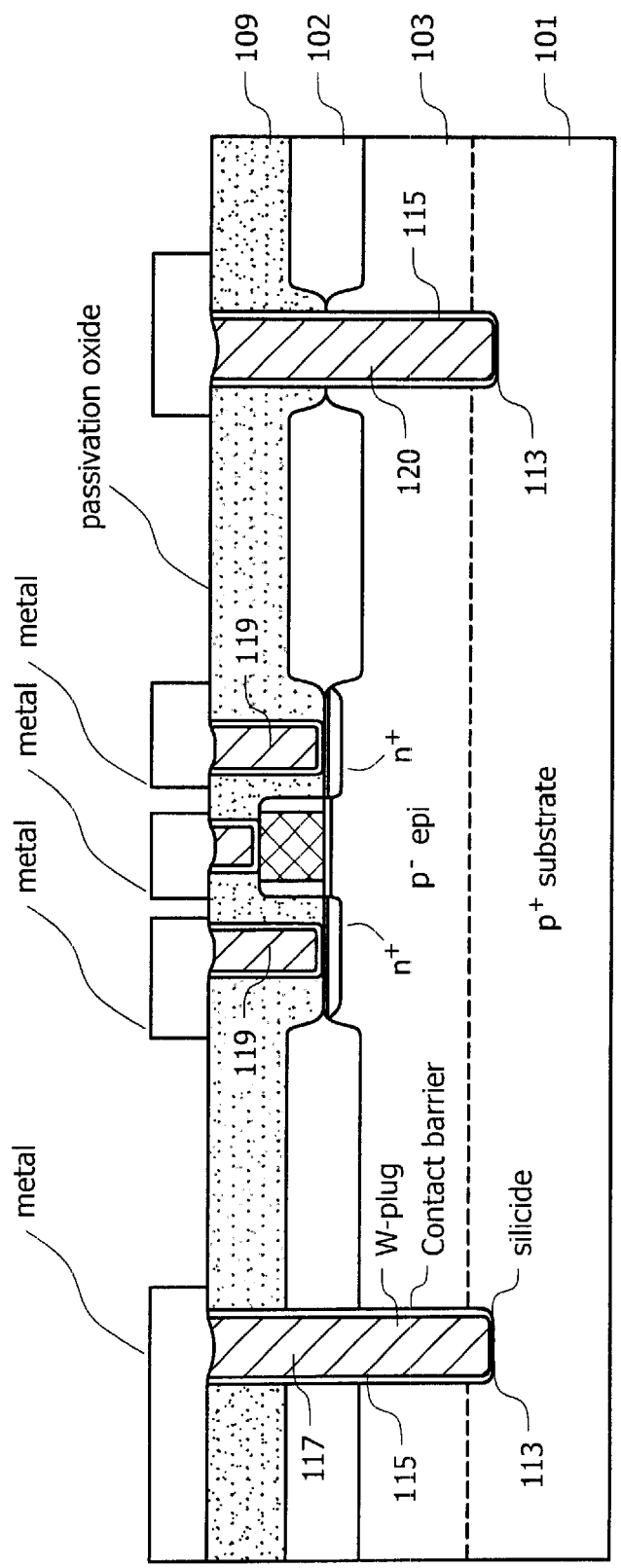

In FIGS. 1a–1c different stages in the manufacturing of a substrate contact are shown. The FIGS. show the manufacturing of a substrate contact in a rudimentary NMOS-process flow. Another application area in which the manu-facturing is of particular importance is in the manufacturing of bipolar components for radio purposes. Moreover, different variations of the method can be used in the manufacturing of CMOS-components and bipolar components.

FIG. 1a shows the active areas defined by for example LOCOS (LOCal Oxidation of Silicon) on a silicon substrate 101, where the substrate also can be made of other semiconductor materials such as for example, germanium, gallium arsenide, silicon carbide, indium phosphide. On top of the silicon substrate an epitaxial layer of silicon 103 has been grown, which typically is 5–10 μm thick. The figure also shows the remaining layer of field oxide 102.

Thereupon, see FIG. 1b, a thin gate oxide is thermally grown, and whereupon a coating of polysilicon 105, which can be heavily doped with a doping of N-type, in order to form the gate, takes place. The gate is defined by means of lithography and dry etching. Implantation, with e.g. arsenic or phosphor, and drivein diffusion of the source-/drain areas 107, is carried out in a self-aligned manner after etching of the gate.

Next, a passivation layer 109 and possibly a future hard mask 111 of preferably silicon nitride and/or oxide are deposited, whereupon a layer of photo resist 112 is applied on the wafer. The layer is then lithographically patterned in order to define the substrate contacts which might be located in the shape of a frame of discreet contacts around the whole or parts of the component. The latter is analogue with the so called P$^+$-guard-ring described in the above cited paper.

The resist pattern having openings of about 1 μm is then by means of dry etching transferred to the hard mask and the oxide layers, in this case a combination of the deposited passivation layer and the thermally grown field oxide. The photo resist is removed from the wafer, followed by an anisotrophic silicon etch. The anisotrophic silicon etch is made so deep, typically several μm, so that it reaches down into the underlying high-doped P$^+$-substrate. After completed etching possible etch remainings such as polymers and other impurities are removed by means of a combination of dry cleaning (plasma-strip) and wet chemical cleaning. The structure after these steps is shown in FIG. 1b.

Photo resist is then again applied on the wafer which is then contact hole patterned and etched. The wafer is cleaned after the contact hole etching, whereby resist remains and other organic impurities are removed with the combination of dry cleaning (plasma strip) and wet chemical cleaning. After etching off the possible hard mask and common wet chemical cleaning, the process proceeds according to previously well-known technique. However, a substrate contact etching is accomplished, etched both through the oxide passivation and deep down into the silicon, approximately 5 μm or at least deeper than the deepest PN-junctions. In ordinary contact hole etching it is however a requirement that the etch is stopped at the silicon surface, and thus only goes through the passivation, in order for the component to work.

As is shown i FIG. 1c a thin layer, such as having a thickness of about 1000 A.U. of a contact metal 113 of for example titanium, platinum or cobalt for contacting is then deposited, for example by means of coherent sputtering, such as ionised metal plasma (IMP) or physical polymering, which later can be silicidized. In immediate connection, another thin metal layer 115, for example having a thickness of about 500 A.U., is deposited by means of for example reactive sputtering or CVD-technique. This so called diffusion barrier which preferably is made of titanium nitride is deposited on the wafer, since it is then desired that the contact holes are conformally filled with a metal, preferably tungsten, by means of CVD-technique. In order to secure a good metallurgical connection with the silicon wafer, said contact metal can be brought to be alloyed with the silicon at an elevated temperature, whereby a silicide can be created in the contact area as indicated above. After depositing the contact metal and the barrier, the contact metal is hence silicidized by means of RTP (Rapid Thermal Processing), or alternatively by means of a traditional oven process.

After the contact formation e.g. tungsten is deposited by means of CVD-technique over the wafer. The CVD-coating is conformally executed, whereby both the contact holes 119 and the substrate contacts 117 will be overgrown (plugged), if the thickness of the deposited metal layer is of the same magnitude as the contact hole dimension. Ordinary metallisation and patterning of the same for connection of the different components to a circuit terminate the process. The result is shown in FIG. 1c.

The metal plugs can also be located at locations not having a field oxide layer 102 as is shown by the metal plug 120.

By using the method described above, a metallic, low-resistant connection with the substrate is obtained. Said metallic substrate contacts may also serve as a shielding cage, a screening cage, around respective component or block of components. Hereby a unique possibility for suppressing cross-talk is provided.

As an alternative to the above described embodiments, for example a uniformly doped, P$^-$- or N$^-$-silicon substrate may be used in the same manner as the P$^+$/P$^-$-epi-material described above. If such a uniformly low-doped material is used, an extra diffusion, i.e. doping, in the bottom of the substrate contacts should however be made in order to secure a low contact resistance.

The above described embodiment results in low-resistant metal contacts to the substrate which have a considerably better performance than the earlier substrate contacts obtained by means of diffusion. In certain cases also doped polysilicon may constitute and serve as the contact to the substrate. In the two latter cases a substantially higher resistance is however obtained. The method of making holes down into the inner of the substrate and then fill this with a conducting material, metal, polysilicon, etc. is easily implemented in existing CMOS and or bipolar flows. Only one additional mask step together with the following anisotrophic silicon etching are added.

The substrate contacts which typically are round 6 μm deep are simultaneously filled with the other standard contacts which are around 1 μm deep, the filling being made by means of for example CVD-tungsten. Also other metals, for example Al, Cu. etc. which are possible to deposit by means of CVD-technique should work in a similar manner.

The fact that the contact resistance between metal and substrate becomes relatively low, since metal is used as connection constitutes further advantages. Furthermore, an attained low temperature budget can be kept. Last but not least the method is much less space demanding than the traditional technique, since no lateral diffusion takes place. The method is furthermore elegant in the sense that the substrate contacts and the usual contacts are filled at the same time. Thus, the filling requires no extra process step.

Moreover, the deep metal contacts of the substrate can be located so closely, that the component or the components, blocks or modules of components, behave as if they were placed in a close screening cage providing a maximal electrical shielding. Thus, the method provides a unique possibility for electrical shielding at component level.

Figure 2:
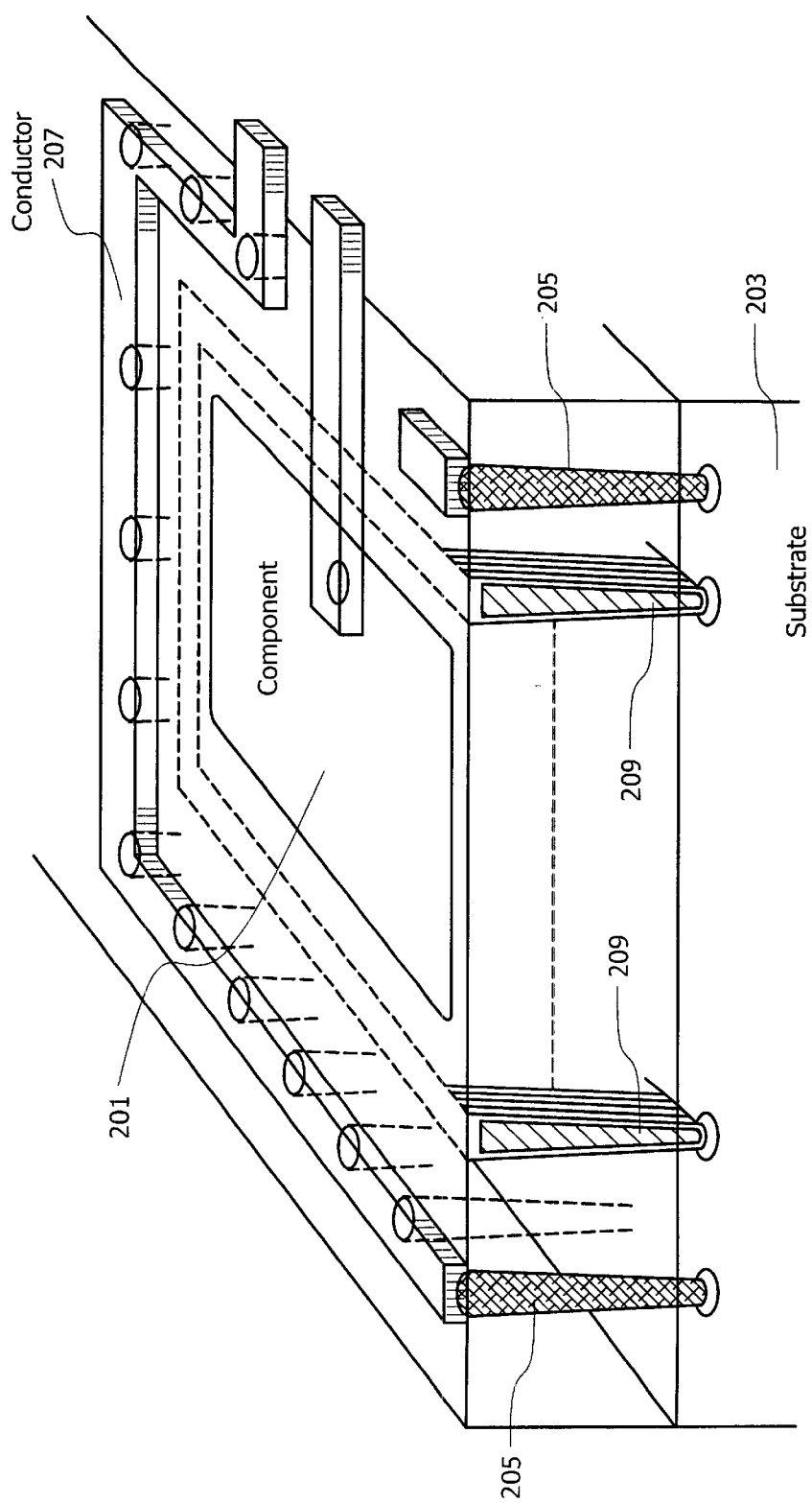
FIG. 2 is an overall view showing a number of substrate contacts arranged in order to shield a component.

In FIG. 2, a semiconductor component which has been shielded according to this principle is shown. Thus, a component, or a block of components 201, is shown on top of a substrate 203. Around this component or this block of components a large number of holes have been made which extend deep down into the substrate 203 and these holes have subsequently been filled with metal in the above described manner in order to form metal plugs 205. These metal plugs 205 are further connected to a conducting material 207, which connects the upper parts of the metal plug 205. The deep substrate contacts can furthermore easily be combined with traditional trench-isolation 209 in order to obtain maximal isolation in combination with good shielding, which is a requirement in the manufacturing of advanced integrated circuits for radio applications.

The obtained substrate contact can also be used in order to laterally shield an electrical signal conductor in a semiconductor structure. This is obtained by means of providing metal plugs manufactured in the above described manner next to, on both sides of, an electrical signal conductor. The electrical signal conductor can also preferably be shielded in the vertical direction in a conventional manner by means of metal planes.

Figure 3:
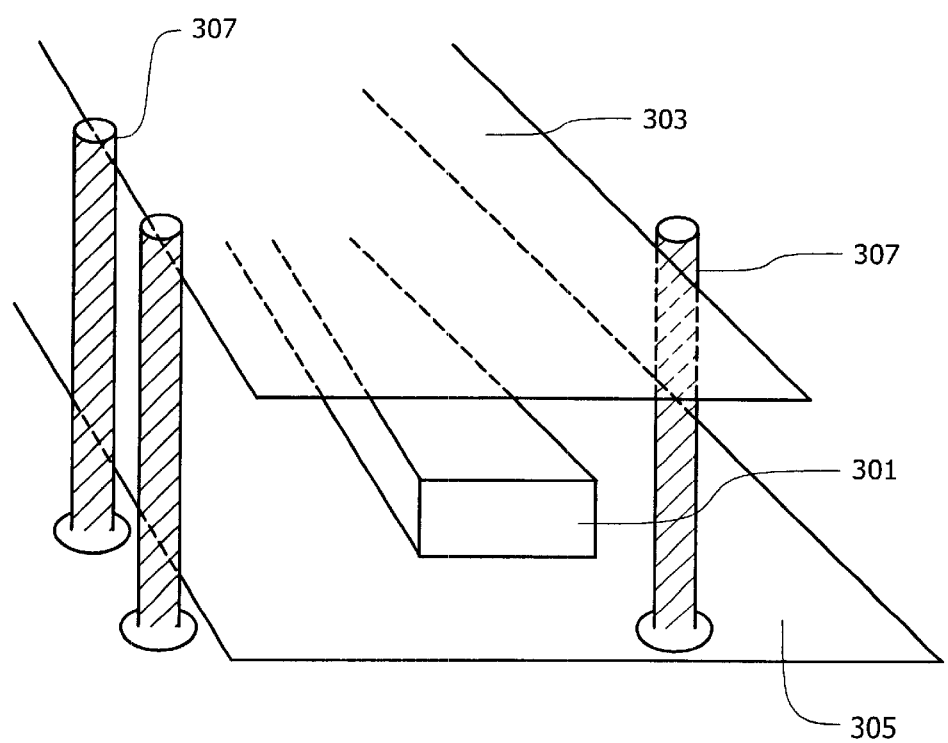
FIG. 3 shows a shielded signal conductor.

In FIG. 3, a conductor 301 in a semiconductor structure shielded according to this principle is shown. The conductor 301 is here arranged between two metal planes 303 and 305, respectively, one above and one below, shielding the conductor in a vertical direction. Furthermore, a number of holes have been made on both sides of the conductor, which reach down to the lower metal plane 305 and which are filled with a metal. The metal plugs 307 obtained in this manner shield the conductor in the lateral direction if they are placed close enough. The top ends of the metal plugs may also, like the material 207 shown in FIG. 2, be connected to an electrically conductive material, not shown.

Figure 4:
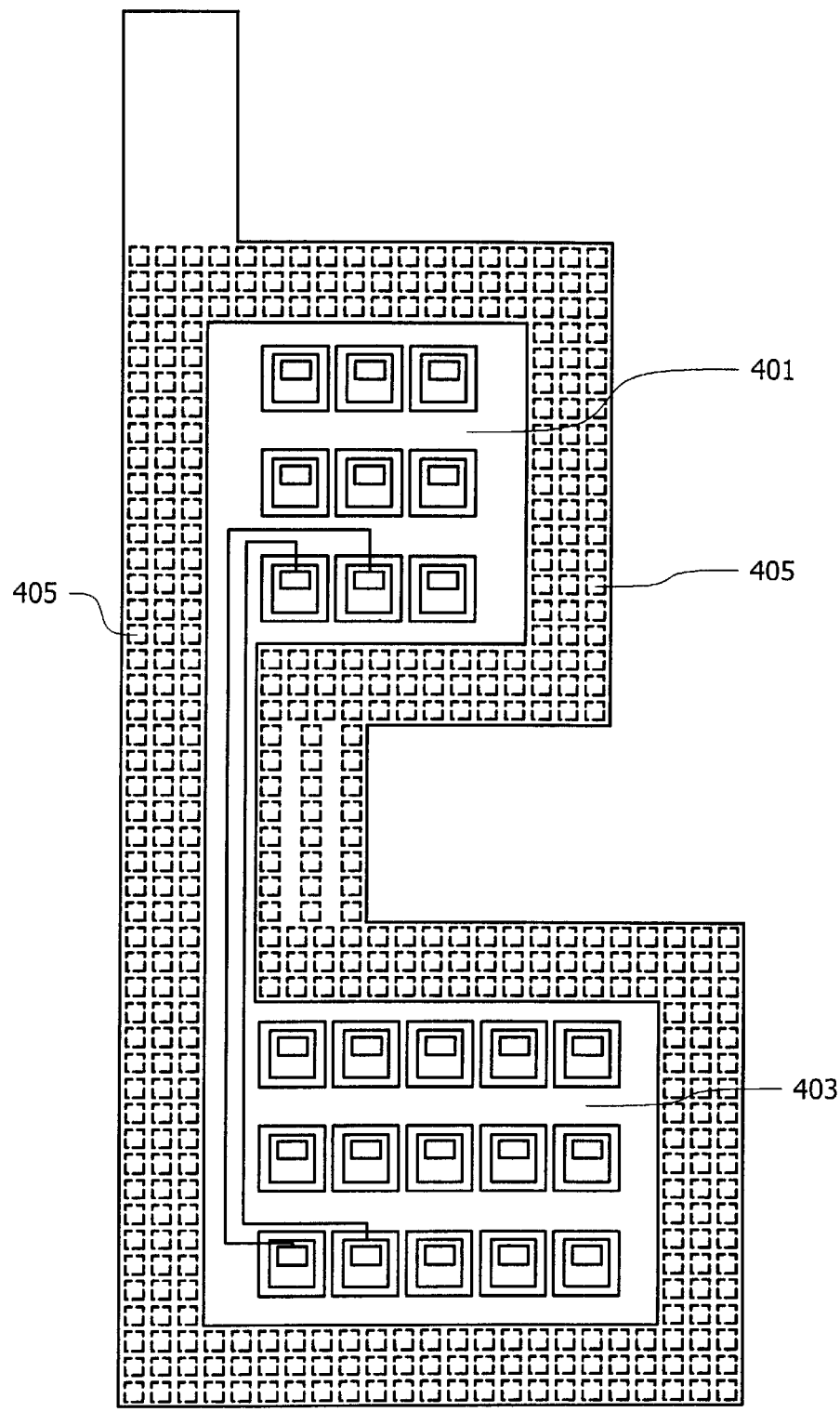
FIG. 4 is an overall view of a number of components arranged on the same substrate.

Furthermore, FIG. 4 shows an overall view of two groups of semiconductor components 401 and 403, arranged on a common substrate, shielded from each other and the environment by means of the above described substrate contact 405. The substrate contacts 405 are in this embodiment arranged in triple rows around the component groups. The purpose of this is to obtain an even better shielding. Furthermore, signal conductors may in this embodiment be arranged between some of the rows of the substrate contacts 405, whereby also the signal conductors become shielded in accordance with the above. The substrate contacts are further formed with an essentially quadratic cross-section and the spacing between the plugs in a row can, for example, be between 50 and 100% of the thickness of the plugs.

Figure 5:
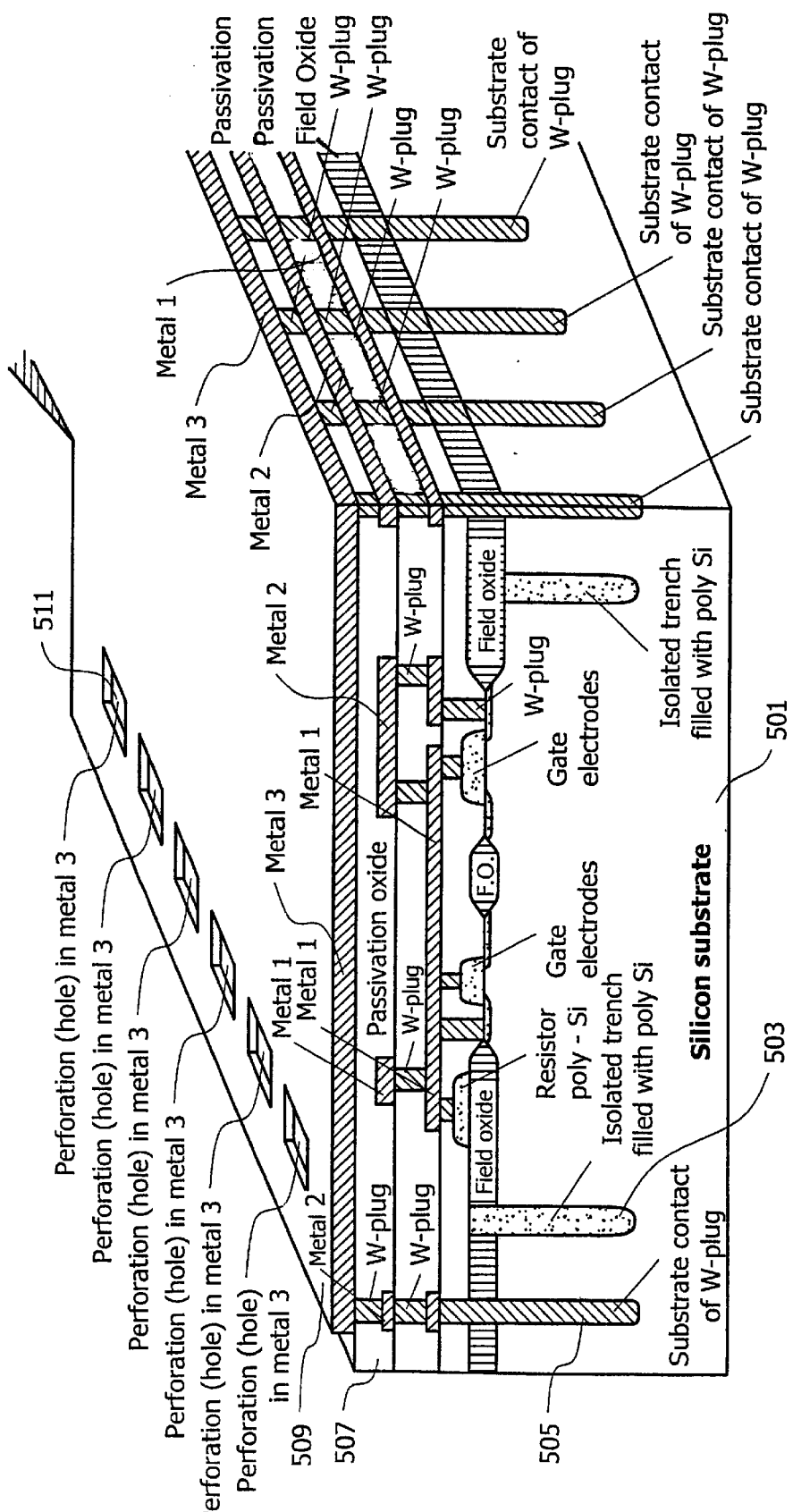
FIG. 5 is a cross-section showing lateral shielding obtained by means of substrate contacts in combination with a vertically shielding upper metal layer.

Finally, in FIG. 5 it is shown how cmponents and blocks of components can be shielded from each other by means of the above described substrate contacts in combination with a metal plane applied on top of the components. Thus, FIG. 5 shows a silicon substrate 501 on which a number of components have been arranged. The components are in this case shielded from each other laterally both by means of conventional trenches 503 filled with isolating polysilicon and also by means of metal substrate contacts 505 of tungsten made according to the above, going deep down into the substrate.

Furthermore, there is an additional metal layer 509 provided on top of the uppermost layer of passivation oxide 507, which is connected to ground. The purpose of this metal layer is to provide a vertical shielding upwards of the components provided on the substrate. In this manner a screening cage for electrical shielding around the components is obtained.

The shielding layer of metal 509 does not need to be closed, it only needs to be arranged to cover such a large part of the top side of the components required to obtain a good vertical electrical upwards shielding. On the contrary it may be advantageous to provide perforations or holes 511 in the metal layer, which act in order to prevent or lower the risk for the metal to come loose.

What is claimed is:

1. A semiconductor component arranged at a surface of a substrate, the semiconductor component comprising an active part and a plurality of contact plugs of a material having a good electrical conductivity, the contact plugs arranged in at least one row positioned at a perimeter of the active part and the contact plugs extending from the surface of the semiconductor component into the substrate and having top regions located at the surface of the semiconductor component and bottom regions that terminate at an inner region of the substrate, the contact plugs being in electrical contact with the substrate at least in said bottom regions, wherein the bottom regions of the contact plugs comprise electrical contact enhancing means that comprise at least one of an additional diffusion and doping layer, thereby forming an electrical interconnection between the inner region of the substrate and the surface, for shielding the active part of the semiconductor component from electrical fields and electrical currents in the substrate.

2. A shielded electrical signal conductor path in a semiconductor structure comprising a semiconductor substrate, the shielded electrical signal conductor path comprising a signal conductor and shielding means, the shielding means comprising a plurality of contact plugs of a material having a good electrical conductivity, the contact plugs arranged in at least one first row that extends along a first side of the signal conductor and in at least one second row that extends along a second, opposite side of the signal conductor and the contact plugs extending from the surface of the semiconductor structure into the semiconductor substrate and having top regions located at the surface of the semiconductor structure and bottom regions that terminate at an inner region of the semiconductor substrate, the contact plugs being in electrical contact with the semiconductor substrate at least in said bottom regions, thereby forming an electrical interconnection between the inner region of the substrate and the surface, for shielding the signal conductor from electrical fields and electrical currents in the substrate, wherein the shielding means further comprise metal planes in the semiconductor structure for shielding the signal conductor in a vertical direction and the contact plugs extend a distance into the semiconductor substrate such that the bottom regions of the plugs reach at least a closest metal plane of a plurality of metal planes that is closest to the surface of the substrate, the plurality of metal planes being located underneath the signal conductor.

3. A shielded electrical signal conductor path in a semiconductor structure comprising a semiconductor substrate, the shielded electrical signal conductor path comprising a signal conductor and shielding means, the shielding means comprising a plurality of contact plugs of a material having a good electrical conductivity, the contact plugs arranged in at least one first row that extends along a first side of the signal conductor and in at least one second row that extends along a second, opposite side of the signal conductor and the contact plugs extending from the surface of the semiconductor structure into the semiconductor substrate and having top regions located at the surface of the semiconductor structure and bottom regions that terminate at an inner region of the semiconductor substrate, the contact plugs being in electrical contact with the semiconductor substrate at least in said bottom regions, wherein the bottom regions of the contact plugs comprise electrical contact enhancing means that comprise at least one of an additional diffusion and doping layer, thereby forming an electrical interconnection between the inner region of the substrate and the surface, for shielding the signal conductor from electrical fields and electrical currents in the substrate.

4. A semiconductor component arranged at a surface of a substrate, the semiconductor component comprising an active part and a multitude of contact plugs of a material having a good electrical conductivity, the contact plugs arranged in at least one row positioned at a perimeter of the active part and the contact plugs extending from the surface of the semiconductor component to the substrate, each contact plug having a top end and a bottom end including a bottom surface, the top end located at the surface of the semiconductor component and the bottom surface located in an inner region of the substrate that is between a top and bottom surface of the semiconductor substrate, the bottom end and bottom surface of each contact plug being in electrical contact with the substrate, and the bottom ends of the contact plugs being located separated from each other and in electrical contact with each other only through the substrate, the contact plugs thereby forming an electrical interconnection between the inner region of the substrate and the surface and shielding the active part of the semiconductor component from electrical fields and electrical currents in the substrate.

5. The semiconductor component of claim 4, wherein the bottom surfaces of the contact plugs are located deeper down into the substrate than PN-junctions of the active part.

6. The semiconductor component of claim 4, wherein the top ends of the contact plugs are interconnected by an electrically conducting metal layer intended to be connected to electrical ground.

7. The semiconductor component of claim 4, wherein the material forming the contact plugs comprises a metal.

8. The semiconductor component of claim 4, comprising at least two parallel rows of the contact plugs at the perimeter of the active part.

9. The semiconductor component of claim 4, wherein the contact plugs are arranged sufficiently close to each other to obtain a good lateral shielding of the active part.

10. The semiconductor component of claim 4, wherein the contact plugs have walls at the substrate, the material forming the contact plugs comprising a silicidized layer at said walls for enhancing electrical contact with the substrate.

11. The semiconductor component of claim 4, wherein the bottom ends of the contact plugs comprise electrical contact enhancing means.

12. The semiconductor component of claim 11, wherein the electrical contact enhancing means comprise an extra diffusion or doping.

13. The semiconductor component of claim 4, wherein the contact plugs have a diameter of substantially 1 $\mu$m.

14. The semiconductor component of claim 4, wherein the contact plugs have a length of substantially 5 $\mu$m.

15. A shielded electrical signal conductor path in a semiconductor structure comprising a semiconductor substrate, the shielded electrical signal conductor path comprising a signal conductor and shielding means, the shielding means comprising a multitude of contact plugs of a material having a good electrical conductivity, the contact plugs arranged in at least one first row that extends along a first side of the signal conductor and in at least one second row that extends along a second, opposite side of the signal conductor and the contact plugs extending from the surface of the semiconductor structure to the semiconductor substrate, each contact plug having a top end located at the surface of the semiconductor structure and a bottom end including a bottom surface, the bottom surface located in an inner region of the semiconductor substrate that is between a top and bottom surface of the semiconductor substrate, the bottom end and bottom surface of each contact plug in electrical contact with the semiconductor substrate and the bottom ends of the contact plugs being located separated from each other, the bottom ends being in electrical contact with each other only through the substrate, the contact plugs thereby forming an electrical interconnection between the inner region of the substrate and the surface, for shielding the signal conductor from electrical fields and electrical currents in the substrate.

16. The shielded electrical signal conductor path of claim 15, wherein the contact plugs are arranged sufficiently close to each other to obtain a good lateral shielding of the signal conductor.

17. The shielded electrical signal conductor path of claim 15, wherein the shielding means further comprise metal planes in the semiconductor structure for shielding the signal conductor in a vertical direction.

18. The shielded electrical signal conductor path of claim 17, wherein the contact plugs extend so long into the semiconductor substrate that they at least reach down to that one of the metal planes that is located closest underneath the signal conductor.

19. The shielded electrical signal conductor path of claim 15, wherein the top ends of the contact plugs are interconnected by an electrically conducting metal layer arranged to be connected to electrical ground.

20. The shielded electrical signal conductor path of claim 15, wherein the material of the contact plugs comprises a metal.

21. The shielded electrical signal conductor path of claim 15, comprising at least two parallel rows of the contact plugs.

22. The shielded electrical signal conductor path of claim 15, wherein the contact plugs are arranged sufficiently close to each other to obtain a good lateral shielding of the signal conductor.

23. The shielded electrical signal conductor path of claim 15, wherein the contact plugs have walls at the substrate, the material of the plugs comprising a silicidized layer at said walls for enhancing electrical contact with the substrate.

24. The shielded electrical signal conductor path of claim 15, wherein the bottom ends of the contact plugs comprise electrical contact enhancing means.

25. The shielded electrical signal conductor path of claim 24, wherein the electrical contact enhancing means comprise an extra diffusion or doping.

26. The shielded electrical signal conductor path of claim 15, wherein the contact plugs have a diameter of substantially 1 $\mu$m.

27. The shielded electrical signal conductor path of claim 15, wherein the contact plugs have a length of substantially 5 $\mu$m.

* * * * *